United States Patent [19]

Choi et al.

[11] Patent Number: 5,015,886

[45] Date of Patent: May 14, 1991

[54] PROGRAMMABLE SEQUENTIAL-CODE RECOGNITION CIRCUIT

[75] Inventors: Jung-Dal Choi; Hyung-Kyu Yim; Jae-Young Do, all of Seoul; Jin-Ki Kim, Daegu, all of Rep. of Korea

[73] Assignee: SamSung Electronics Co., Ltd., Suwon, Rep. of Korea

[21] Appl. No.: 356,172

[22] Filed: May 24, 1989

[30] Foreign Application Priority Data

Jul. 18, 1988 [KR] Rep. of Korea .................. 1988-8954

[51] Int. Cl.⁵ .................. H04Q 7/00; H04Q 9/00; H04M 11/02; H03K 3/01
[52] U.S. Cl. .................. 307/465; 307/443; 364/716; 340/825.52; 340/825.44; 340/825.47; 365/189.12; 377/79; 377/81
[58] Field of Search .................. 307/465–469, 307/443, 448, 243; 364/716, 784; 340/825.52, 825.53, 825.54, 825.44, 825.83–825.91; 377/37, 54, 70, 71, 72, 73, 74, 75, 79, 81; 365/189.01, 189.09, 189.12, 206, 207, 230.01, 230.09, 239, 240

[56] References Cited

U.S. PATENT DOCUMENTS

| | | | |
|---|---|---|---|
| 3,922,508 | 11/1975 | Brady | 371/20.5 |
| 4,225,948 | 9/1980 | Schuller | 365/239 |
| 4,427,980 | 1/1984 | Fennell et al. | 340/825.52 |
| 4,431,991 | 2/1984 | Bailey et al. | 340/825.52 |
| 4,772,811 | 9/1988 | Fujioka et al. | 307/465 |
| 4,802,133 | 1/1989 | Kanuma et al. | 365/189.12 X |
| 4,873,671 | 10/1989 | Kowshik et al. | 365/189.12 X |

*Primary Examiner*—Stanley D. Miller
*Assistant Examiner*—David R. Bertelson
*Attorney, Agent, or Firm*—Robert E. Bushnell

[57] ABSTRACT

There is disclosed a programmable sequential code recognition circuit comprising an individual code recognition circuit for recognizing each input code, and a sequence recognition circuit for recognizing the sequency given for individual codes obtained by combination of input signals, so that a specific mode may be selected by the input combination sequentially inputted.

3 Claims, 3 Drawing Sheets

PROGRAMMABLE SEQUENTIAL-CODE RECOGNITION CIRCUIT

TECHNICAL BACKGROUND

The present invention concerns a programmable sequential-code recognition circuit for selecting a specific mode of a chip including a test mode in a semiconductor device having a plurality of operating modes.

With a semiconductor memory gradually tending to high integration and high reliability, the semiconductor chip has contained circuits for measuring various electrical properties of the chip, or various test modes, including a normal read/write mode. Such a special mode circuit is formed so as not to function in the normal read/write mode, thereby not affecting the inside of the chip. Usually, the special mode circuit serves as a buffer to connect a signal to the inside of the chip in the voltage exceeding an externally applied voltage, or includes a sensing circuit to produce a signal for operating the special mode circuit while to stop functioning of the normal red/write circuit. In a conventional semiconductor device having a test mode for evaluating the properties of the chip and other special modes together with the noraml read/write mode, the mode selection is accomplished by using a specially prepared pad or by adding a high voltage sensing circuit to an address/control pad.

Such a specially prepared pad is added to the pad used for the normal read/write mode, and is supplied with a power source to select the special mode. On the other hand, when using the high voltage sensing circuit, the high voltage (12–14V) is applied to the address/control pad connected with the high voltage sensing circuit, which then operates to select the special mode.

The problem arising from using the specially prepared pad is that each special mode needs each separate pad to thereby increase the chip size, and when packaging, the specially prepared pads are not often bonded, resulting in failure of test or increase of the number of the packaging pins. Furthermore, the method using the high voltage sensing circuit has a problem that it needs a separate high voltage source.

SUMMARY OF THE INVENTION

It is accordingly an object of the present invention to provide a programmable sequential-code recognition circuit which sequentially recognizes individual input codes to select a single mode corresponding to a special code so as to make it possible to test after packaging or to select a desired operating mode without a high voltage source.

It is another object of the present invention to provide a programmable sequential-code recognition circuit which may have a different input sequential code for each individual chip by enabling the individual code to be programmed.

According to the present invention, for a semiconductor device having a plurality of operating modes is provided a programmable sequential code recognition circuit, comprising an individual code recognition circuit for recognizing each input code obtained by combination of input signals, and a sequence recognition circuit for recognizing the sequence given for the individual codes, whereby a specific mode may be selected by the input combination sequentially inputted.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENT

Figure 1:
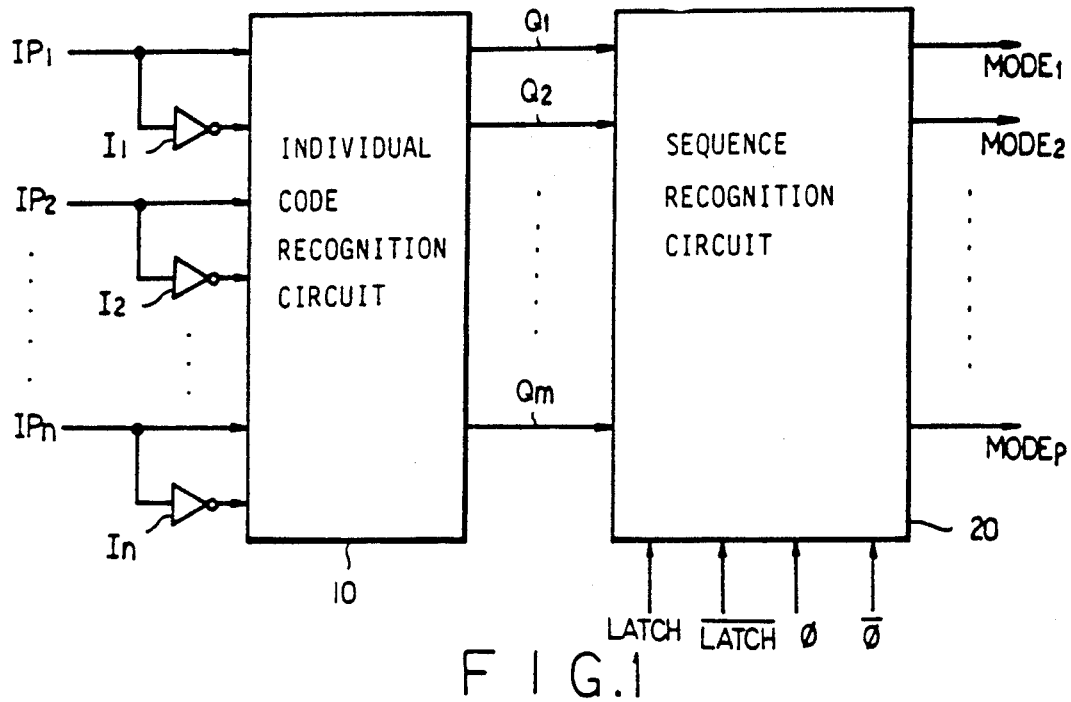
FIG. 1 is a block diagram for illustrating the present invention.

Referring to FIG. 1, the programmable sequential code recognition circuit comprises an individual code recognition circuit 10 for recognizing each input code, and a sequence recognition circuit 20 for recognizing the sequence given for individual codes obtained by combination of input signals IP1–IPn. The individual code recognition circuit 10 decodes by simple combination of logic circuit the input signals IP1–IPn and their inverted signals ($\overline{IP1-IPn}$) that are supplied through an input buffer (not shown) or generated by combination of programmable elements (not shown), and sequentially produces the output corresponding to each individual code. The sequence recognition circuit 20 receives the output of the individual code recognition circuit 10 so as to recognize the sequence given for the individual codes.

Figure 2:
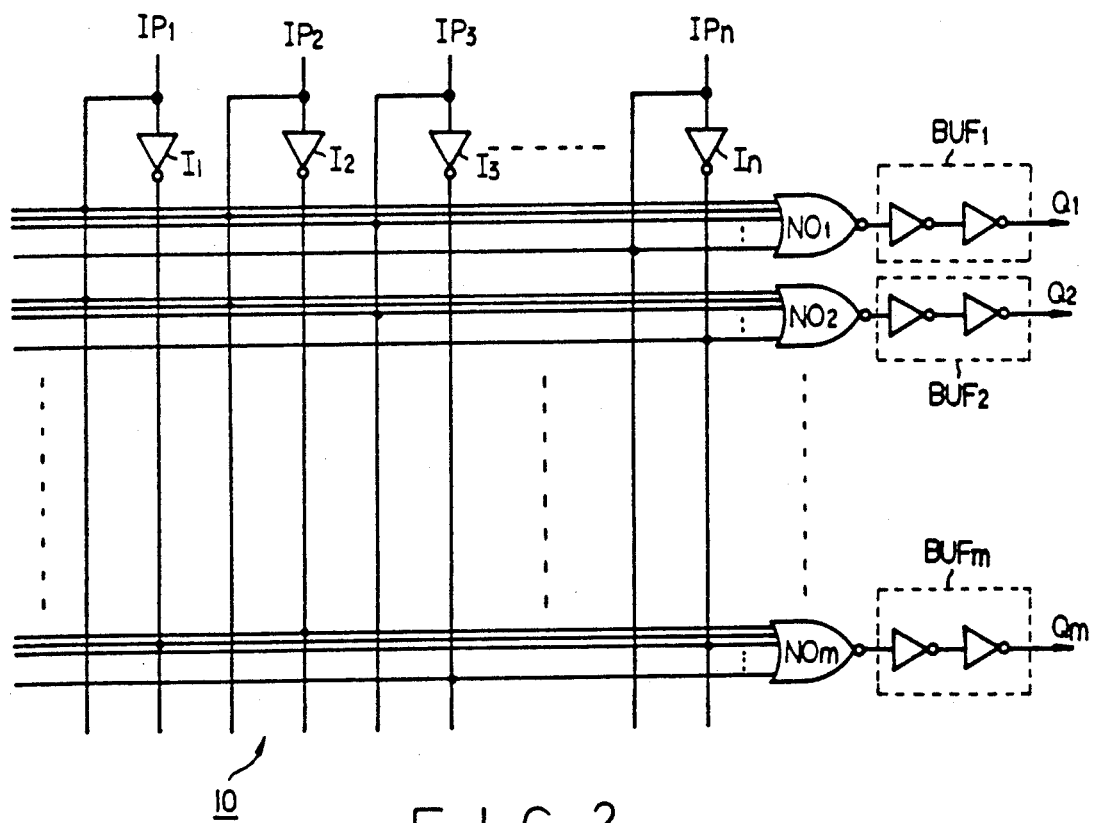
FIG. 2 is an embodiment of the individual code recognition circuit according to the present invention.

Referring to FIG. 2, the individual code recognition circuit 10 comprises a plurality of inverters (I1-In), a plurality of NOR gates (NO1-NOm), and a plurality of buffers (BUF1-BUFm) each comprising two inverters connected in series, each input of the buffers being connected with each output of the NOR gates (NO1--NOm). The individual code recognition circuit 10 is programmed to output code recognition signals (Q1-Qm) of logic high state by recognizing the individual codes obtained by combination of the input signals (IP1-IPn). The individual code recognition circuit 10 combines the input signals (IP1-IPn) that is inputted through an input buffer (not shown) or generated by combination of programmable elements (not shown), and sequentially produces the code recognition signals (Q1, Q2, ... Qm) according to the programmed state. Namely, when the input signals (IP1-Ipn) are sequentially inputted depending on the programmed state, through the NOR gates (NO1-NOm) and the buffers (BUF1-BUFm) are sequentially produced the code recognition signals (Q1-Qm) of logic high state. The individual code recognition circuit 10 may be repalced by another logic circuit depending on the programmed state.

Figure 3:
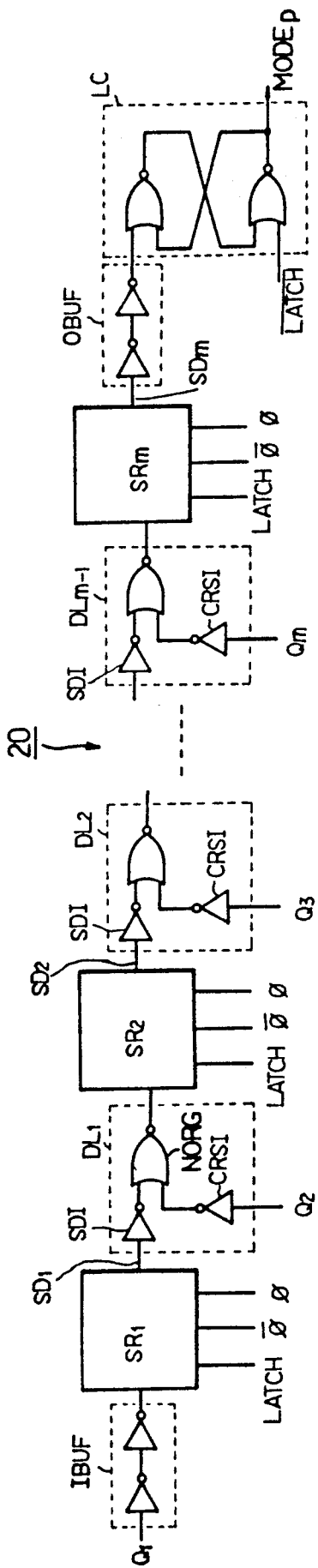
FIG. 3 is an embodiment of the sequence recognition circuit of the present invention.

Referring to FIG. 3, a preferred embodiment of the sequence recognition circuit 20 comprises a plurality fo shift registers (SR1-SRm) and a plurality of decoding logic circuits (DL1-DLm−1) each connected between the shift registers. The number (m) of the shift registers (SR1-SRm) is same as that of the individual codes which is obtained by combination of the input signals (IP1-IPn) inputted into the individual code recognition circuit (10). The first shift register (SR1) is preceded by an input buffer (IBUF) comprising two inverters connected in a series, while the "m"th shift register (SRm) is followed by an output buffer (OBUF) formed in the same manner as the input buffer (IBUF). The output terminal of the output buffer (OBUF) is connected with a latch circuit (LC) comprising two NOR gates.

The shift registers (SR1-SRm) receive either an output of the input buffer (IBUF) or one output of the preceding decoding logic circuits (DL1-DLn−1) to output shift data (SD1-SDm) depending on the latch signal (LATCH) and clock signals $\phi$ and $\bar{\phi}$. The decoding logic circuits (DL1-DLn−1) each comprises a shift data inverter (SDI) for inverting the shift data output of the preceding shift register, a code recognition signal inverter (CRSI) for inverting the code recognition signal (Q2-Qm) of the individual code recognition circuit 10, and a NOR gate (NORG) for NOR-gating the output of the recognition signal inverter (CRSI). The latch circuit (LC) comprises upper and lower NOR gates. One input terminal of the upper NOR gate is connected with the output terminal of the output buffer (OBUF), while one input terminal of the lower NOR gte is connected with the inverted latch signal ($\overline{LATCH}$). The other input terminals are crossly connected with each output terminal of the NOR gates.

The sequence recognition circuit 20 of FIG. 3 works as follows. The code recognition signals (Q1-Qm) of logic high state sequentially outputted from the individual code recognition circuit 10 are inputted into the input buffer (IBUF) and the decoding logic circuit (DL1-DLm−1). Further, the latch signal of logic high state generated by the external clock and a pair of clock signals $\phi$ and $\bar{\phi}$ are commonly inputted into all the shift registers (SR1-SRm), while the inverted latch signal ($\overline{LATCH}$) of logic low state that is the opposite logic state to the latch signal (LATCH) is inputted into the latch circuit (LC). Consequently, a first code recognition signal (Q1) of logic high state outputted from the individual code recognition circuit (10) is inputted into the first shift register (SR1) through the input buffer (IBUF).

Receiving the first high-state signal, the first shift register (SR1) outputs the first shift data (SD1) of logic high state according to the latch signal (LATCH) of logic high state and the mutually inverted clock signals $\phi$ and $\bar{\phi}$. The first shift data (SD1) and a second code recognition signal (Q2) outputted from the individual code recognition circuit 10 are as logic low state signals inputted through the shift data inverter (SD1) and the code recognition signal inverter (CRSI) into the NOR gate (NORG) which outputs the signal of logic high state. Receiving the high state signal, the second shift register (SR2) works in the same manner as the first register (SR1) to produce the second shift data (SD2) of logic high state. Continuously working in the same manner, the "m"th shift register (SRm) outputs the "m"th shift data (SDm). The "m"th shift data (SDm) of logic high state is inputted through the output buffer (OBUF) into one input terminal of the upper NOR gate in the high state. Further, the negative latch signal ($\overline{LATCH}$) of logic low state is inputted into one input terminal of the lower NOR gate. The other input terminal of the upper NOR gate receives a logic low state signal because the latch circuit (LC) outputted the low state signal in the preceding state. Hence, the upper NOR gate produces a logic low state output which is inputted into the other input terminal of the lower NOR gate, which produces a logic high state output to operate the special mode.

Figure 4:
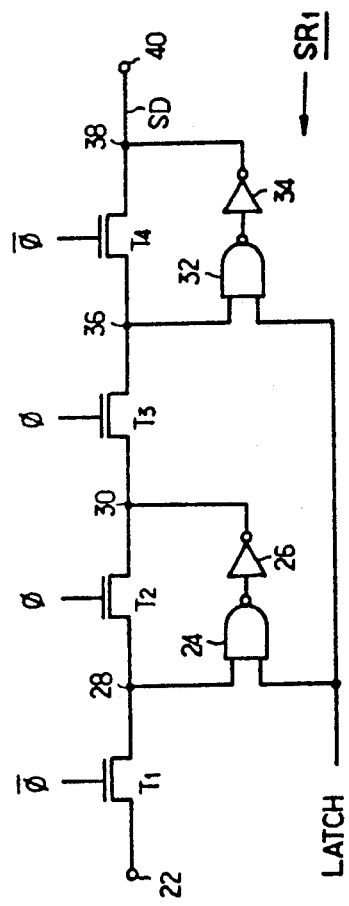
FIG. 4 illustrates a preferred embodiment circuit of the shift register shown in FIG. 3.

Referring to FIG. 4, the shift register (SR1-SRn) each comprises an input terminal 22 for receiving the output of the input buffer (IBUF) or any one of the decoding logic circuits (DL1-DLm−1), an output terminal 40 for transferring the shift data (SD1-SDm) to the next decoding logic circuit (Dl1-DLm−1) or the output buffer (OBUF), a plurality of MOS transistors T1-T4 whose drain-source paths are connected in series between the input terminal 22 and the output terminal 44 and receiving through each gate one of the clock signals $\phi$ and $\bar{\phi}$, NAND gates 24, 32 whose one of two input terminals each is respectively connected with the first node 28 and the third node 36, and other input terminals commonly receive the latch signal (LATCH), and onverters 26, 34 whose input terminals are respectively connected with the outputs of the NAND gates 24, 32 and their output terminals each are connected with a second and a fourth nodes 30, 38.

The operation of the shift register SR1 of FIG. 4 will be explained. It is assumed that the signal outputted from the decoding logic circuit (DL1-DLn−1 or the input buffer (IBUF) is inputted through the terminal 22 in the logic high state and the latch signal (LATCH) is inputted in the logic high state. In this case, if the inverted clock signal $\bar{\phi}$ of logic low state is inputted into the gates of the first and the fourth MOS transistors T1, T4, and the clock signal $\phi$ of the logic high state is inputted into the gates of the second and the third MOS transistors T2, T3, the first and the fourth MOS transistors T1, T4 turn off, while the second and the third MOS transistors T2, T3 on. Consequently, the first to fourth nodes 28, 30, 36, 38 become low, and thus, the output terminal 40 produces the logic low-state output. Thereafter, if the clock signal $\phi$ becomes low and the inverted clock signal $\bar{\phi}$ high, the first and the fourth MOS transistors, T1, T4 turn on, while the second and the third T2, T3 off. Hence, the high state signal inputted through the input terminal 22 is transferred through the first MOS transistor T1, and therefore, the first node 28 becomes logic high state. Moreover, while the second MOS transistor T2 is off, the second node 30 becomes high through the NAND gate 24 and the inverter 26 because the first node 28 and the latch signal (LATCH) are all in the high state. However, since the third MOS transistor T3 keeps the off state, the third and fourth nodes 36, 38 remain low, and thus, the output terminal 40 produces the low state output.

Thereafter, if the signal inputted through the input terminal 22 becomes low, the clock signal $\phi$ high, and the inverted clock signal $\bar{\phi}$ low, then the first and the fourth MOS transistors T1, T4 turn off, and the second and the third MOS transistor T2, T3 on. In this case, the logic high signal of the second node 30 is reset by combination of the second MOS transistor T2, the NAND gate 24 and the inverter 26, and is then transferred to the third node 36 through the third MOS transistor T3. While the fourth MOS transistor T4 is in the off state, the fourth node 38 becomes logic high state through the NAND gate 32 and the NOR gate 24 because the third node 36 and the latch signal (LATCH) are all in the logic high state. Consequently, through the output terminal 40 is outputted the shift data (SD) of logic high state. In the meanwhile, the first and the third nodes 28, 36 receive the high-state signals of the second and the fourth nodes 30, 38 through the second and the fourth MOS transistors T2, T4, thereby maintaining the high state each.

Thereafter, if the clock signal φ becomes low and the inverted clock dignal $\overline{\phi}$ high, then the first and the fourth MOS transistors T1, T4 are on, and the second and the third MOS transistors off. Thus, through the first MOS transistor T1 is transferred the logic low state signal to the first node 28. While the second MOS transistor T2 is off, the second node 30 becomes low though the NAND gate 24 and the inverter 26 because the first node 28 is low and the latch signal (LATCH) high. However, the third node signal and the latch signal (LATCH) are high state, and therefore, through the NAND gate 32 and the inverter 34 is the fourth node 38 in the logic high state to produce the shift data (SD) of logic high state at the output terminal 40. Further, since the fourth MOS transistor T4 is on, the signal of third node 36 is transferred and latched into the fourth node 38, thereby maintaining the high state. Thereafter, if the clock signal φ becomes high and the inverted clock signal $\overline{\phi}$ low, then the first and the fourth MOS transistors T1, T4 are off, and the second and the third MOS transistors T2, T3 on, so that the third and the fourth nodes 36, 38 become low to thereby produce the low state signal at the output terminal.

FIGS. 5(A)-5(H) represent an example of timing diagrams showing various aspects of operation upon selection of a particular mode (i.e. P-mode) according to the invention.

Figure 5:
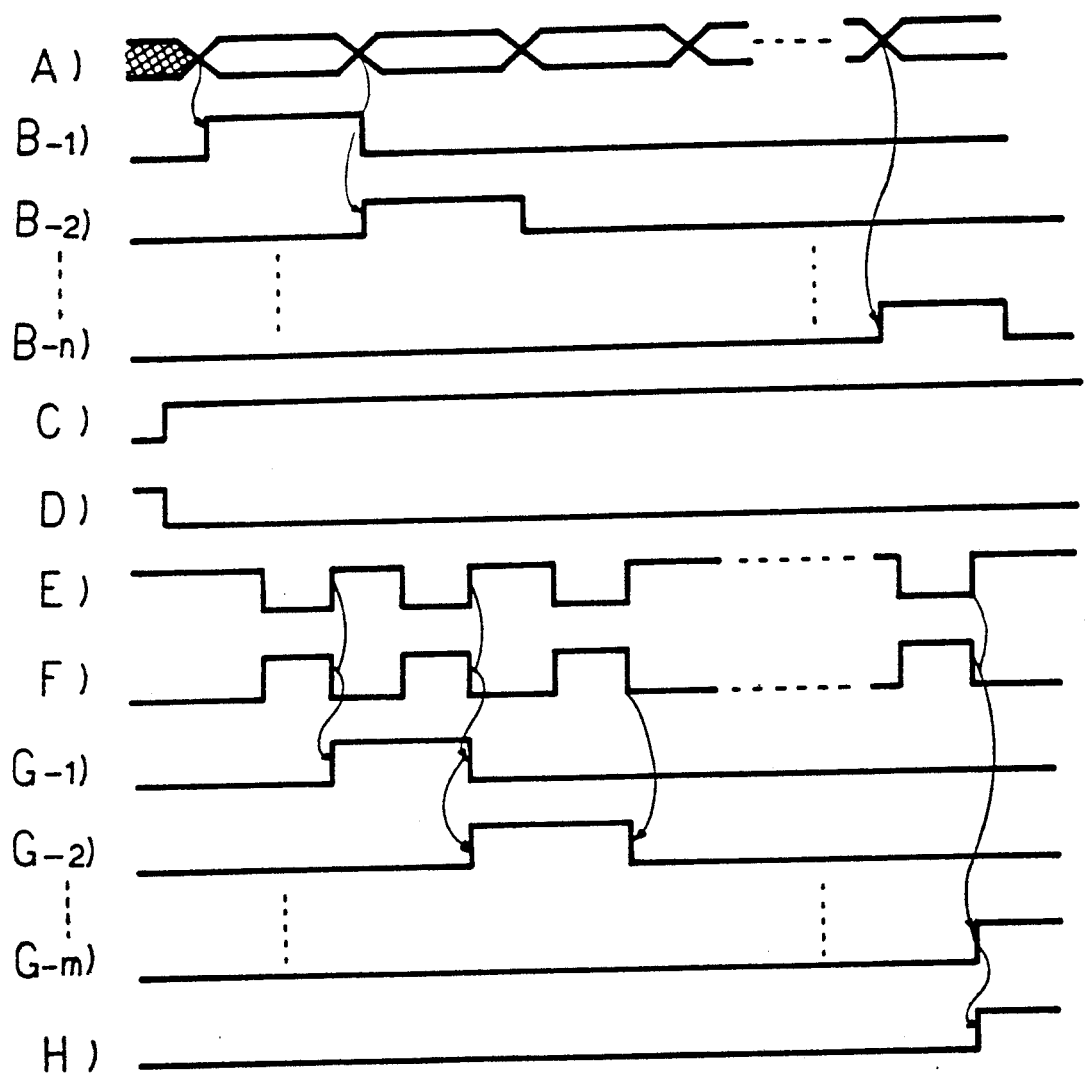
FIG. 5 is a timing diagram for illustrating the aspect of operations of the inventive circuit.

The present invention will now be described more specifically with reference to the operational waveforms shown in FIG. 5. By an externally inputted clock pulse, the latch signal (LATCH) of high state as shown in FIG. 5(C) is inputter into the shift register (SR1-SRm), and the inverted latch signal ($\overline{LATCH}$) of low state as shown in FIG. 5(D) is inputted into the latch circuit (LC). Thereafter, the individual codes IP1-IPn as shown in FIG. 5(A) are sequentially inputted into the individual code recognizing circuit 10. When the first code is inputted, through the NOR gate NO1 and the firs buffer (BUF1) is outputted the first output signal Q1 in the high state as shown in FIG. 5(B-1). The first output signal Q1 of high state is inputted in the high state through the input buffer (IBUF) into the input terminal 22 of the first shift register SR1. The clock signal φ as shown in FIG. 5(E) is inputted into the gates of the second and the third MOS transistors T2, T3, and the inverted clock signal $\overline{\phi}$ as shown in FIG. 5(F) into the gates of the first and the fourth MOS transistors T1, T4. The clock signals φ, $\overline{\phi}$ drive alternately the MOS transistors T1-T4, and the latch signal (LATCH) drives the NAND gates 24, 26 to produce the first shift data SD1 as whown in FIG. 5(G-1) through the output terminal 40 when the clock signal φ is in the rising edge. If a second individual code is inputted into the individual code recognition circuit 10 during the first shift data SD1 being outputted, through the NOR gate NO2 and the second buffer (BUF2) is outputted the second code recognition signal W2 in the high state as sown in FIG. 5(B-2). The first shift data SD1 of the first shift register SR1 and the second code recognition signal Q2 outputted from the second buffer (BUF2) of the individual code recognition circuit 10 are inputted into the NOR gate (NORG) in the low state through the shift data inverter SD1 and the code signal inverter CRSI. Thus, the NOR gate (NORG) transfers the high state signal to the second shift register SR2, and the second shift register SR2 operated in the same manner as the first shift register SR1 so as to produce the second shift data SD2 of high state as shown in FIG. 5(G2) when the clock signal φ is in the rising edge of the next period. In this case, when the shift data SD2 of the second shift register SR2 becomes high, the shift data SD1 of the first shift register SR1 becomes low. Thereafter, the operations as described above being continued, the "m"th shift register SRm produces the "m"th shift data Sdm as shown in FIG. 5(G-m). The "m"th shift data SDm is inputted through the output buffer (OBUF) into one input terminal of the upper NOR gate of the latch circuit (LC). Into one input terminal of the lower NOR gate is imputted the negative latch signal ($\overline{LATCH}$) as shown in FIG. 5(D), and as the latch circuit (LC) produces the low state signal in the preceding state, into the other input terminal of the upper NOR gate is inputted the low state signal. Hence, the upper NOR gate outputs the low state signal to be inputted into the other input terminal of the lower NOR gate, so that the lower NOR gate outputs the high state signal to select the P-mode. Such a logic high output is shown in FIG. 5, by a signal referred to as "MODEp" out of the latch circuit (LC).

At this time, if the specified input codes are not inputted in a given sequence, then the output of the shift register is not shifted, so that all the shift registers are reset to the original state, thereby the desired mode being not enabled. Thus, according to the present invention, it will be understood that the individual code recognition circuit of FIG. 2 is comprised of programmed logic circuits, so that the desired mode may be selected.

As described above, the inventive circuit recognizes the individual codes by combination of the inputs, and makes it possible to select the desired mode only by sequential input given for the recognized individual codes without an additional pad or a high voltage source. Furthermore, the inventive circuit may have as many selecting modes as at maximum (2∩n) m, that is, a total number cases of obtainable by the number of the inputs and sequence arrangement, as well as be used to inhibit any particular mode of operation in a semiconductor device having a plurality of operating modes For example, it may be used in various non-volatile memory elements such as EPROM, EEPROM, etc. to prevent unauthorized modifying or copying the stored data. Additionally, the inventive circuit has the advantage that it is possible in a programmed logic array to change, without restriction, the code for selecting a special mode because the particular mode can be obtained by applying programmable input conbination.

While the invention has been particularly shown and described with reference to a preferred embodiment, it will be understood by those skilled in the art that modifications in detail may be made without departing from the spirit and scope of the invention.

What is claimed is:

1. In a semiconductor device having a plurality of operating modes, a programmable sequential code recognition circuit comprising individual code recognition means, having a combination of a plurality of logic elements, for receiving a plurality of sequential input codes to thereafter provide an individual code according to recognition of said input codes, and sequence recognition means, coupled to the output of said individual code recognition means, for outputting a signal to enable or disable a particular operating mode upon the semiconductor device, in response to logic combination of said each individual code input, whereby a desired particular operating mode may be selected in the semiconductor device.

2. A programmable sequential code recognition circuit as claimed in claim 1, wherein said sequence recognition means comprises a plurality of shift registors sequentially connected with each other, whose number equals to that of the individual codes in said individual code recognition means, the input of said shift registors being controlled by the outut of said individual code recognition means corresponding to a preceding stage output.

3. A programmable sequential code recognition circuit as claimed in claim 2, wherein said individual code recognition means is comprised of logic elements of a programmable logic array.

* * * * *

UNITED STATES PATENT AND TRADEMARK OFFICE
CERTIFICATE OF CORRECTION

PATENT NO. : 5,015,886

DATED : 14 May 1991

INVENTOR(S) : Jung-Dal CHOI et al.

It is certified that error appears in the above-identified patent and that said Letters Patent is hereby corrected as shown below:

Column 1, Line 23, change "red" to --read--;

Line 26, change "noraml" to --normal--;

Column 2, Line 57, change "repalced" to --replaced--;

Line 61, change "fo" to --of--;

Column 3, Line 22, change "gte" to --gate--;

Column 4, Line 17, change "onverters" to --inverters--;

Column 5, Line 4, change "dignal" to --signal--;

Line 34, change "inputter" to --inputted--;

Line 53, change "whown" to --shown--;

UNITED STATES PATENT AND TRADEMARK OFFICE
CERTIFICATE OF CORRECTION

PATENT NO.   : 5,015,886
DATED        : 14 May 1991
INVENTOR(S)  : Jung-Dal CHOI et al.

It is certified that error appears in the above-identified patent and that said Letters Patent is hereby corrected as shown below:

Column 6,  Line  4, beginning with "In this case", please begin a new paragraph;

Line 13, change "imputted" to --inputted--;

Line 43, insert a period after "modes";

Column 8, line 1, change "outut" to --output--.

Signed and Sealed this

Sixteenth Day of March, 1993

*Attest:*

STEPHEN G. KUNIN

*Attesting Officer*     *Acting Commissioner of Patents and Trademarks*